United States Patent [19]
Ehman et al.

[11] Patent Number: 4,715,383
[45] Date of Patent: Dec. 29, 1987

[54] METHOD FOR REDUCING ARTIFACTS IN NMR IMAGES

[75] Inventors: Richard L. Ehman; Joel P. Felmlee, both of Rochester, Minn.

[73] Assignee: General Electric Company, Milwaukee, Wis.

[21] Appl. No.: 928,504

[22] Filed: Nov. 10, 1986

[51] Int. Cl.[4] .............................................. A61B 5/05
[52] U.S. Cl. ..................................... 128/653; 324/309
[58] Field of Search ................ 128/653; 324/307, 309, 324/306

[56] References Cited

U.S. PATENT DOCUMENTS

| | | | |
|---|---|---|---|
| 4,021,726 | 5/1977 | Garroway et al. | 324/0.5 A |
| 4,034,191 | 7/1977 | Tomlinson et al. | 235/151.3 |
| 4,431,968 | 2/1984 | Edelstein et al. | 324/309 |
| 4,458,203 | 7/1984 | Young | 324/309 |
| 4,531,094 | 7/1985 | Ordidge et al. | 324/309 |
| 4,532,473 | 7/1985 | Wehrli | 324/306 |
| 4,535,290 | 8/1985 | Post et al. | 324/309 |

OTHER PUBLICATIONS

"Flow Effects in Rapid Flash NMR Images", J. Frahm, A. Haase, K. D. Merboldt, D. Matthaei, M. Deimling, H. Weber. Presented at the 5th Annual Meeting of the Society of Magnetic Resonance in Medicine held in Montreal, Canada in Aug. of 1986.

Primary Examiner—Kyle L. Howell
Assistant Examiner—Ruth S. Smith
Attorney, Agent, or Firm—Quarles & Brady

[57] ABSTRACT

A method for eliminating flow, motion and aliasing artifacts includes a series of saturation pulse sequences which are interleaved with the NMR pulse sequences used to acquire the data needed to reconstruct the desired image. Whereas, the NMR pulse sequences extract data from the volume of interest to be imaged, the saturation pulse sequences excite and saturate spins in the adjacent regions.

5 Claims, 13 Drawing Figures

METHOD FOR REDUCING ARTIFACTS IN NMR IMAGES

BACKGROUND OF THE INVENTION

The field of the invention is nuclear magnetic resonance imaging methods and systems. More particularly, the invention relates to a method for reducing image artifacts caused by flow, motion and phase aliasing.

Any nucleus which possesses a magnetic moment attempts to align itself with the direction of the magnetic field in which it is located. In doing so, however, the nucleus precesses around this direction at a characteristic angular frequency (Larmor frequency) which is dependent on the strength of the magnetic field and on the properties of the specific nuclear species (the magnetogyric constant $\delta$ of the nucleus). Nuclei which exhibit this phenomena are referred to herein as "spins".

When a substance such as human tissue is subjected to a uniform magnetic field (polarizing field $B_z$), the individual magnetic moments of the spins in the tissue attempt to align with this polarizing field, but precess about it in random order at their characteristic Larmor frequency. A net magnetic moment $M_z$ is produced in the direction of the polarizing field, but the randomly oriented magnetic components in the perpendicular, or transverse, plane (x-y plane) cancel one another. If, however, the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_1$, which is rotating, or spinning, in the x-y plane at the Larmor frequency. The degree to which the net magnetic moment $M_z$ is tipped, and hence, the magnitude of the net transverse magnetic moment $M_1$ depends primarily on the length of time and magnitude of the applied excitation field $B_1$.

The practical value of this phenomenon resides in the signal which is emitted by the excited spins after the excitation signal $B_1$ is terminated. In simple systems the excited nuclei induce an oscillating sine wave signal in a receiving coil. The frequency of this signal is the Larmor frequency, and its initial amplitude, $A_0$, is determined by the magnitude of the transverse magnetic moment $M_1$. The amplitude, A, of the emission signal decays in an exponential fashion with time, t:

$$A = A_0 e^{t/t^*2}$$

The decay constant $1/T^*_2$ depends on the homogeneity of the magnetic field and on $T_2$, which is referred to as the "spin-spin relaxation" constant, or the "transverse relaxation" constant. The $T_2$ constant is inversely proportional to the exponential rate at which the aligned precession of the spins would dephase after removal of the excitation signal $B_1$ in a perfectly homogeneous field.

Another important factor which contributes to the amplitude A of the NMR signal is referred to as the spin-lattice relaxation process which is characterized by the time constant $T_1$. This is also called the longitudinal relaxation process as it describes the recovery of the net magnetic moment M to its equilibrium value along the axis of magnetic polarization (z). The $T_1$ time constant is longer than $T_2$, much longer in most substances of medical interest.

The NMR measurements of particular relevance to the present invention are called "pulsed NMR measurements." Such NMR measurements are divided into a period of excitation and a period of signal emission. Such measurements are performed in a cyclic manner in which the NMR measurement is repeated many times to accumulate different data during each cycle or to make the same measurement at different locations in the subject. A wide variety of preparative excitation techniques are known which involve the application of one or more excitation pulses ($B_1$) of varying magnitude and duration. Such excitation pulses may have a narrow frequency spectrum (selective excitation pulse), or they may have a broad frequency spectrum (nonselective excitation pulse) which produces transverse magnetization $M_1$ over a range of resonant frequencies. The prior art is replete with excitation techniques that are designed to take advantage of particular NMR phenomena and which overcome particular problems in the NMR measurement process.

When utilizing NMR to produce images, a technique is employed to obtain NMR signals from specific locations in the subject. Typically, the region which is to be imaged (region of interest) is subjected to a sequence of NMR measurement cycles which vary according to the particular localization method being used. The received NMR signals are digitized and processed to reconstruct the image using one of many well known reconstruction techniques. To perform such a scan, it is, of course, necessary to elicit NMR signals from specific locations in the subject. This is accomplished by employing magnetic fields ($G_x$, $G_y$, and $G_z$) which have the same direction as the polarizing field $B_0$, but which have a gradient along the respective x, y and z axes. By controlling the strength of these gradients during each NMR cycle, the spatial distribution of spin excitation can be controlled and the location of the NMR signals can be identified.

NMR has rapidly developed into an imaging modality which is utilized to obtain tomographic, projection and volumetric images of anatomical features of live human subjects. Such images depict the nuclear-spin distribution (typically protons associated with water and fat), modified by specific NMR properties of tissues, such as spin lattice ($T_1$), and spin-spin ($T_2$) relaxation time constants. They are of medical diagnostic value because they depict anatomy and allow tissue characterization. However, such magnetic resonance images are often plagued by artifacts caused by fluid flow (flow artifacts) and by body motion (motion artifacts).

Referring particularly to FIG. 8, an NMR system employs a receiver coil which is receptive to NMR signals produced anywhere within a relatively large "receptive volume." In a whole body NMR system, for example, the receiver coil is sensitive to NMR signals produced in a circular cylindrical receptive volume which is coextensive with the lumen in which the patient is positioned. Within this receptive volume, an image volume is defined by the magnetic field gradients, excitation pulse frequency bandwidth and receiver frequency bandwidth. While this image volume is smaller than the receptive volume, it is often larger than the particular area, or volume which is of clinical interest. It is the structures within the clinical volume of interest which are of interest to the clinician and which must be imaged accurately and clearly.

Such structures are represented in FIG. 8 by the object "A". Unfortunately, events which occur outside the clinical volume of interest can produce artifacts which obscure object A. For example, object "B", which lies in the image volume, may be in motion due to respiration, and it can produce motion artifacts which spill into the clinical volume of interest and obscure the object A. Similarly, objects which are in the receptive volume, but which lie outside the image volume, may produce artifacts inside the clinical volume of interest. The object "C", for example, may be aliased into the volume of interest where it obscures the object A. And finally, there may be objects "D" which lie outside the clinical volume of interest along the z axis (the direction of the polarizing magnetic field) which either move into the volume of interest during the NMR scan or which move in and out during the scan. This occurs, for example, as a result of blood flowing into the volume of interest or objects moving in response to respiration. In either case, fresh spins are introduced which distort the image.

Several kinds of flow artifacts can cause problems in clinical NMR imaging. In FIG. 9a, blood vessels (a) are shown passing through the plane-of-section of an NMR image (b). The ideal NMR image which is reconstructed is shown in FIG. 9b and it accurately depicts vascular structures with a high degree of contrast between lumens and surrounding tissue. Vascular structures tend to have low signal intensity with most NMR pulse sequences employed in clinical application. This is due to a number of physical mechanisms, including washout and dephasing of excited spins during the NMR measurement cycle. In an accurate image, the low intensity of flowing blood enables identification of intraluminal pathology such as intimal flaps (c) associated with atherosclerotic dissection and thrombi or atherosclerotic plaques (d), both of which appear clearly in FIG. 9b.

As shown in FIG. 9c artifacts that are created during the NMR reconstruction can severely degrade the diagnostic quality of images by obscuring anatomic detail. A number of physical mechanisms such as flow related enhancement and even-echo rephasing of excited spins can lead to increased intensity within vascular structures. The view-to-view phase and amplitude variations of intraluminal contents can cause severe artifacts that extend into the image around vessels (e). The pattern of flow artifacts depends on the characteristics of flow, the type of NMR sequence, and the reconstruction technique. The presence of increased intensity within vascular lumens can easily mask pathological findings and prevent their recognition (f). In some cases, the intraluminal signals can simulate the appearance of pathological structures such as thrombi. The process also tends to decrease the contrast between vascular structures and surrounding tissues (g), thereby reducing the morphological information in the image. An admixture of these phenomena affects most vessels in typical NMR images.

A number of methods have been proposed for eliminating flow and motion artifacts. Gating techniques are employed, for example, to synchronize the NMR scan with the respiratory or cardiac cycle in order to minimize motion artifacts. Several NMR pulse sequences have been proposed to either desensitize the NMR measurement to the phase perturbations caused by flowing spins, or to sensitize it to flow in such a manner that the effects of flow can be separated from the reconstructed images. None of these methods have proven entirely satisfactory, either from a performance standpoint, or because of their adverse impact on scan time or the type of NMR measurements that maY be performed.

SUMMARY OF THE INVENTION

The present invention relates to a method of eliminating artifacts in NMR images, and particularly, artifacts caused by events occurring outside the volume of interest. More specifically, the invented method includes the step of regularly applying excitation pulses during the NMR scan of the volume of interest such that spins outside the volume of interest are saturated. As a consequence, the saturated spins cannot produce a significant NMR signal and cannot significantly effect the reconstructed image.

A general object of the invention is to remove artifacts caused by spins flowing into the volume of interest during the NMR scan. According to the present method, spins from outside the volume of interest are saturated and cannot produce a significant NMR signal. Saturation results from the repeated application of excitation pulses and the consequent inability of the spins to recover any significant net magnetization. Accordingly, when such saturated spins flow into the volume of interest during the NMR scan, they cannot produce any significant transverse magnetic moment $M_1$ and they manifest themselves as darkened areas in the image. This is in stark contrast to some prior methods in which such fresh inflow of spins create brightened areas on the image. By employing the present invention, therefore, the interior of blood vessels appear darkened rather than brightened on the image.

A more specific object of the invention is to improve NMR images of the cardiovascular system for clinical diagnostic purposes. Because the present invention darkens the interior of blood vessels, there is more contrast with the surrounding, brighter, stationary tissues and intraluminal lesions. This improved contrast facilitates the diagnosis of abnormalities such as intimal flaps associated with dissection, thrombi, and intraluminal tumors.

Yet another object of the invention is to eliminate artifacts caused by motion which occurs outside the volume of interest. In many instances, an image is sought from a region of the patient in which there is no body motion, however, body motion which occurs in adjacent regions produces artifacts that spill over into the desired image. For example, very accurate and detailed NMR images are possible of the spinal column, but body motion due to respiration produces artifacts which are transposed into the desired image. According to the present invention, the spins in these adjacent regions are saturated by the regular application of excitation pulses, and they cannot produce significant signals which can possibly be reconstructed as artifacts in the desired image.

Another general object of the invention is to eliminate artifacts in the desired image caused by "aliasing" of structures outside the volume of interest. The aliasing problem is due to inherit limitations in some image reconstruction techniques which lead to a practical limit on the degree to which spatial resolution can be increased by strengthening the magnetic gradients. In accordance with the present invention, NMR signals produced by spins outside the volume of interest are suppressed and cannot produce significant artifacts due to this aliasing phenomena. By saturating spins outside the volume of interest, a high resolution image can thus be obtained over any portion of the human anatomy.

Yet a further general object of the invention is to provide a method which will accomplish all of the above objectives and which is easily implemented in current NMR scanner systems. The present invention may be implemented by the addition of one or more excitation pulses and one or more concurrent gradient pulses which are interleaved with the normal NMR pulse sequence employed in the scan. These additional pulses add an insignificant time interval to each NMR measurement cycle and they may be produced with existing hardware and only minor changes to system software.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

DESCRIPTION OF THE PREFERRED EMBODIMENT

Figure 1:
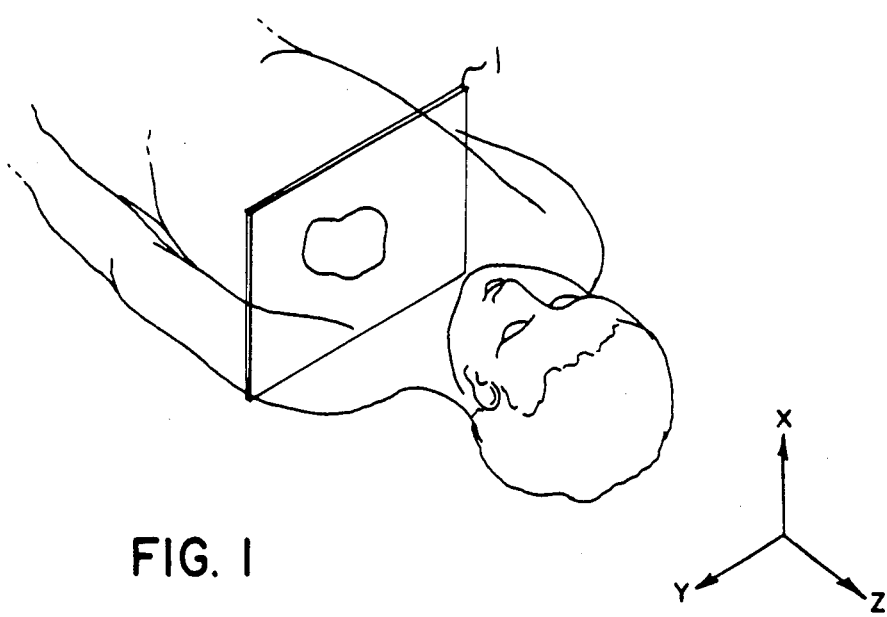
FIG. 1 is a pictoral view of a patient which shows an image that may be formed using the NMR method of the present invention.

Referring particularly to FIG. 1, the present invention is embodied in a full body NMR imaging system which is capable of receiving a patient and producing a two-dimensional image at a slice, or cross section, taken through the patient. The position and orientation of the slice, which is to be imaged, is determined by the magnitude of magnetic field gradients applied along the respective x, y and z axes of the NMR imaging system. A slice 1 is shown in FIG. 1, which is taken through the patient's heart, although the magnetic field gradients can be controlled to produce an image through any section or volume and from any desired orientation.

Figure 2:
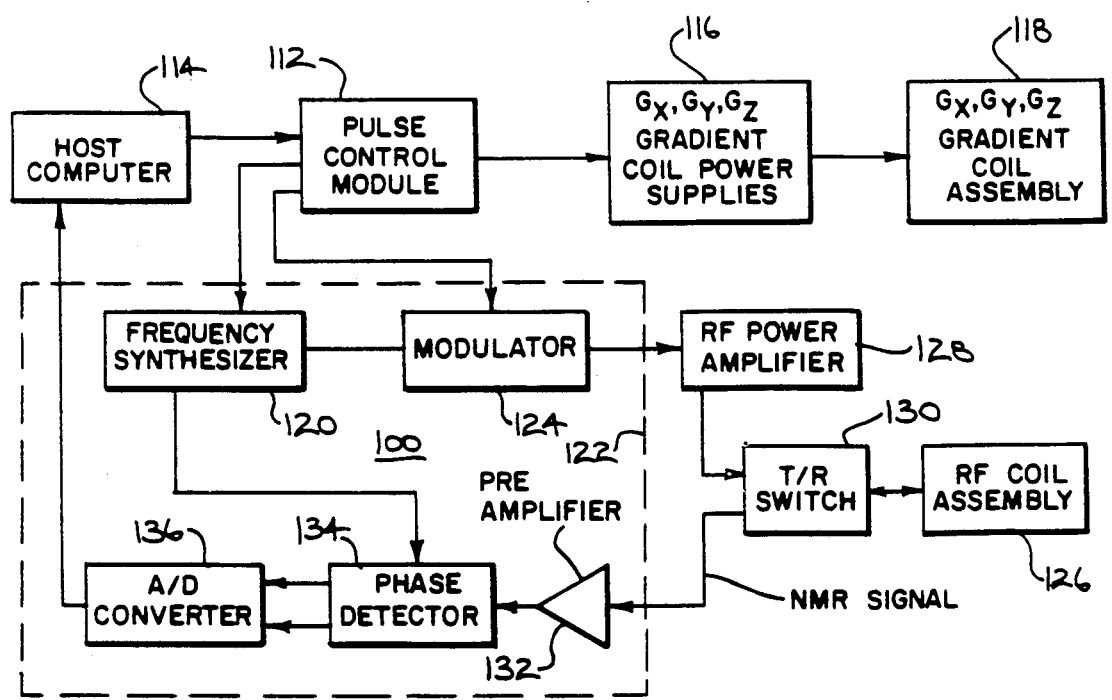
FIG. 2 is an electrical block diagram of an NMR system which employs the present invention.

The preferred embodiment of the invention has been incorporated in an NMR imaging system which is commerically available from the General Electric Company and is sold under the trademark "Signa." FIG. 2 is a simplified block diagram of this NMR imaging system. The system includes a pulse control module 112 which receives command signals from a host computer 114. The pulse control module 112 provides properly timed pulse waveform signals to magnetic field gradient power supplies collectively designated 116 which energize gradient coils forming part of a gradient coil assembly generally indicated by a block 118. The assembly 118 contains coils which, when energized by the power supplies, produce the $G_x$, $G_y$, and $G_z$ magnetic fields in the direction of the polarizing magnetic field, but with gradients directed in the x, y and z directions, respectively, of the Cartesian coordinate system. The use of the $G_x$, $G_y$ and $G_z$ gradients in NMR imaging applications is well known in the art, and the specific use in the present invention will be described in more detail below.

Continuing with reference to FIG. 2, the pulse control module 112 also provides activating pulses to an RF synthesizer 120, which is part of an RF transceiver system, portions of which are enclosed by dash-line block 122. The pulse control module 112 also supplies modulating signals to a modulator 124 which modulates the output of the RF frequency synthesizer 120. The modulated RF signals are applied to an RF coil assembly 126 through an RF power amplifier 128 and a transmit/receive switch 130. The RF signals are used to produce the transverse excitation field $B_1$ which excite spins in the patient. As will be described in more detail below, the center frequency and the frequency bandwidth of these excitation pulses $B_1$ are controlled by the pulse control module 112 to selectively excite spins both inside the region of interest and in the surrounding regions.

The NMR signals from the excited nuclear spins are sensed by the RF coil assembly 126 and applied through the transmit/receive switch 130 to an RF preamplifier 132. The amplified NMR signals are applied to a quadrature phase detector 134, and the detected signals are digitized by A/D converter 136 and applied to computer 114 for storage and processing in a well-known manner.

Figure 3:
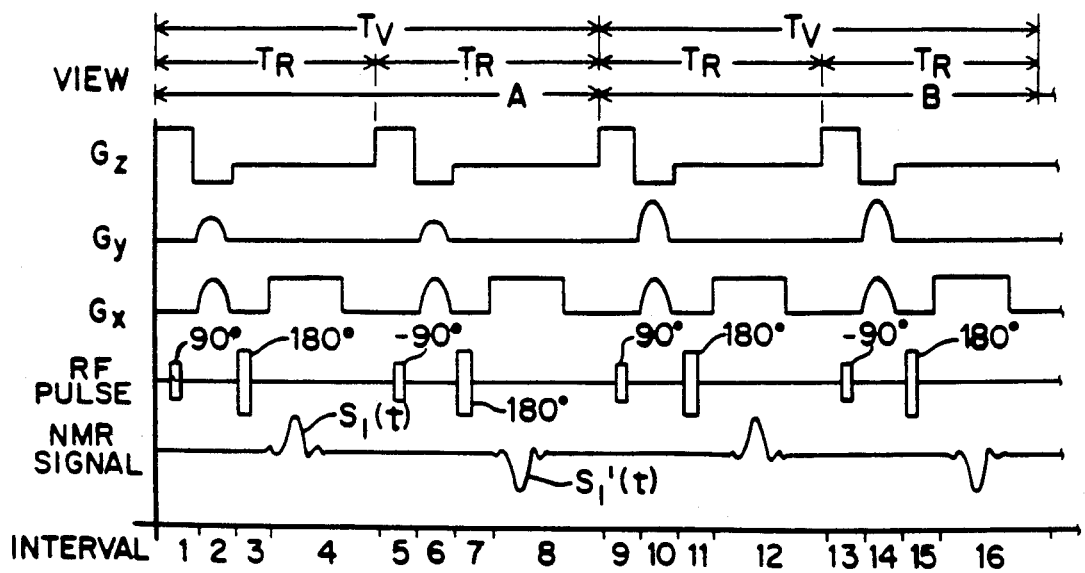
FIG. 3 is an exemplary prior art NMR imaging pulse sequence which is employed by the system of FIG. 2 and which is an NMR pulse sequence to which the present invention may be easily added.
Figure 8:
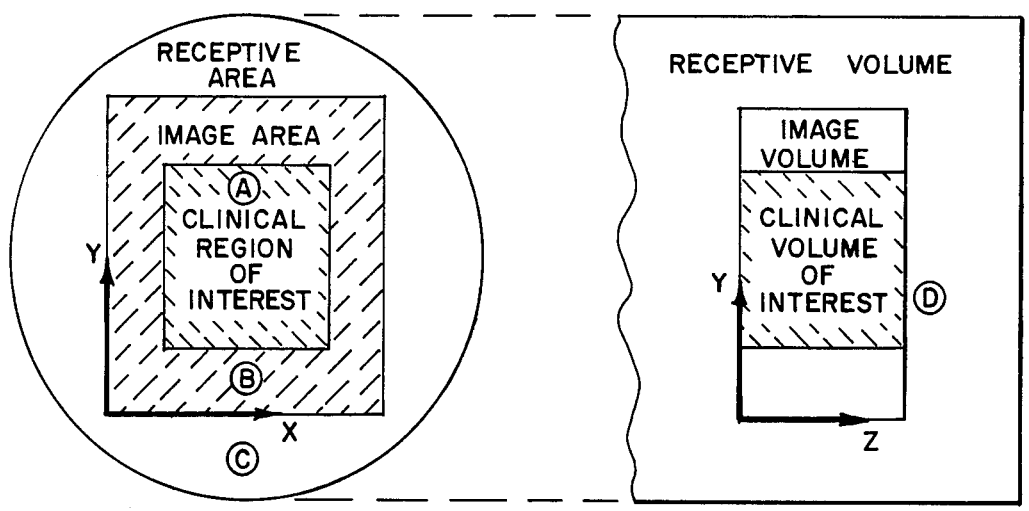
FIG. 8 is a schematic illustration of the volume of interest and the surrounding regions.

Reference is made to FIG. 3, which depicts two "views" of a conventional imaging pulse sequence of the type known in the art as two-dimensional Fourier transform (2DFT), and which is frequently also referred to as two-dimensional "spin-warp." This pulse sequence is useful in obtaining, in a well-known manner, imaging NMR data to reconstruct images of an object being investigated. The two views are indicated at "A" and "B" and each view is identical with the exception of the phase-encoding gradient field $G_y$. Each view is a pulse sequence which utilizes phase-alternated RF excitation pulses $B_1$ which, as disclosed and claimed in U.S. Pat. No. 4,443,760, produce phase-alternated NMR signals $S_1(t)$ and $S_1'(t)$ to cancel certain baseline errors in the NMR system.

Referring now to View A in FIG. 3, there is shown in interval 1 (indicated along the horizontal axis) a selective 90° RF excitation pulse $B_1$ applied in the presence of a positive $G_z$ magnetic field gradient pulse. Pulse control module 112 (FIG. 2) provides the needed control signals to the frequency synthesizer 120 and modulator 124 so that the resulting excitation pulse is of the correct phase, frequency and frequency bandwidth to excite spins only in a predetermined region of the object being imaged. The frequency of the synthesizer 120 is dependent on the strength of the applied polarizing magnetic field $B_0$ and the particular NMR species being imaged in accordance with the well-known Larmor equation. The pulse control module 112 also applies activating signals to the gradient power supplies 116 to generate, in this case, the $G_z$ magnetic field gradient pulse.

Continuing with reference to FIG. 3, $G_x$, $G_y$ and $G_z$ gradient pulses are applied simultaneously in interval 2. The $G_z$ gradient in interval 2 is a rephasing pulse typically selected such that the time integral of the $G_z$ gradient waveform over interval 2 is approximately equal to $-\frac{1}{2}$ of the time integral of the $G_z$ gradient waveform over interval 1. The function of the negative $G_z$ pulse is to rephase the spins which are excited in interval 1. The $G_y$ gradient pulse is a phase-encoding pulse selected to have a different amplitude in each of Views A, B, . . . , etc., to encode spatial information in the direction of that gradient. The number of different $G_y$ gradient amplitudes (and hence, the number of views in the scan) is typically selected to equal at least the number of pixel resolution elements the reconstructed image will have in the phase-encoding direction (Y). Typically, 128, 256, or 512 different gradient amplitudes $G_y$ are selected and in the typical NMR system, the $G_y$ values are incremented a fixed amount from one view to the next until the NMR scan is complete.

The $G_x$ gradient pulse in interval 2 is a dephasing pulse needed to dephase the excited spins by a predetermined amount to delay the time of occurrence of a spin-echo NMR signal $S_1(t)$ in interval 4. The spin-echo NMR signal is produced typically by the application of a 180° transverse excitation pulse $B_1$ which reverses the direction of dephasing so as to produce the spin-echo signal. The spin-echo signal is sampled in interval 4 in the presence of a gradient pulse $G_x$ to encode spatial information in the direction (X) of this gradient.

As indicated above, baseline error components can be eliminated by using an additional NMR measurement in each view. This second measurement is substantially identical to the first with the exception that the excitation pulse $B_1$ in interval 5 of View A is selected to be 180° out of phase (as suggested by the minus sign) relative to the excitation pulse $B_1$ in interval 1 of View A. As a result, the spin-echo NMR signal $S_1'(t)$ in interval 8 is 180° out of phase with the NMR spin-echo signal $S_1(t)$ in interval 4. If the NMR signal $S_1'(t)$ is subtracted from $S_1(t)$, only those components of the signals with reversed sign in the signal $S_1'(t)$ are retained. The baseline error components thus cancel. This two step process may be implemented several times for each view to allow additional signal averaging. Also, under certain conditions, other techniques for eliminating baseline errors may be employed so that only one measurement cycle per view is required.

The process described above with reference to View A is repeated for View B and so on for all amplitudes of the phase-encoding $G_y$ gradient. The NMR data which is collected during this scan is stored in the host computer 114 where it is processed to produce image data suitable for controlling a CRT display.

Figure 4:
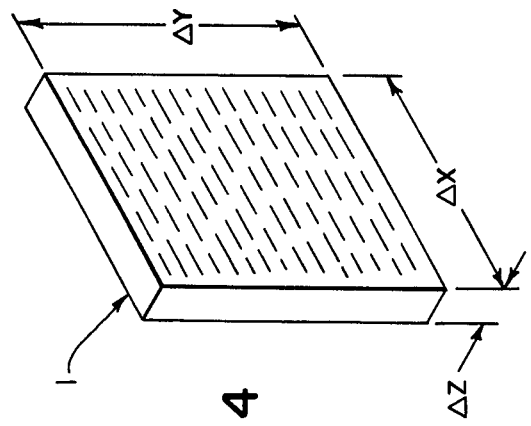
FIG. 4 is a graphic representation of a section from which NMR signals are obtained to produce an image.

Referring particularly to FIGS. 1 and 4, the region of interest in the vast majority of medical applications is a slice 1. Although the resulting image appears like a cross sectional view through the patient, the slice 1 is a volume which has height ($\Delta y$), width ($\Delta x$) and thickness ($\Delta z$). The location and size of this volume of interest are controlled by the magnitude of the magnetic field gradients $G_y$, $G_x$ and $G_z$ and the frequency of the transverse excitation pulses $B_1$. For example, the location of the slice 1 along the z axis of the scanner is determined by the magnitude of the gradient $G_z$, and its thickness, $\Delta z$ is determined by the frequency bandwidth of the excitation pulses $B_1$. The slice 1 is thicker when the $B_1$ field frequency bandwidth is increased. Indeed, the bandwidth can be made large enough that the thickness ($\Delta z$) of the slice 1 is coextensive with the length of the NMR scanner system. In such case, the excitation pulse $B_1$ is said to be "nonselective."

There are a number of different techniques for defining the width ($\Delta x$) and height ($\Delta y$) of the volume of interest. In the 2DFT embodiment of the present invention, the height $\Delta y$ is determined by the number and size of the steps in the phase-encoding gradient $G_y$. If the number of phase-encoding steps is fixed at 256, for example, the height ($\Delta y$) of the slice 1 is determined by the magnitude of each step ($\Delta G_y$) in the gradient $G_y$ between views of the complete scan. The location of the volume of interest along the x axis, on the other hand, is determined by the magnitude of the $G_x$ magnetic field gradient at the moment the NMR signal is being received and the center frequency and bandwidth of the receiver filter. The width ($\Delta x$) of the region of interest is determined by the bandwidth of the NMR signal which is processed. That is, the wider the range of frequencies in the NMR signal which are processed, the wider the slice which is imaged.

The particular method which is employed to define the volume of interest from which NMR signals are to be received and processed is not particularly important to the present invention. What is important is that such a volume of interest is defined by the particular NMR measurement being used, and that a surrounding, or adjacent, region is also thereby defined. It is a teaching of the present invention that during the NMR scan of the volume of interest the spins in the surrounding region may be systematically subjected to transverse excitation pulses $B_1$ during the acquisition of NMR data from the volume of interest. This is illustrated best in FIGS. 7a–7c, where the volume of interest is shown at 1, located in the circular, cylindrical lumen of a whole body NMR scanner system.

Figure 7A:
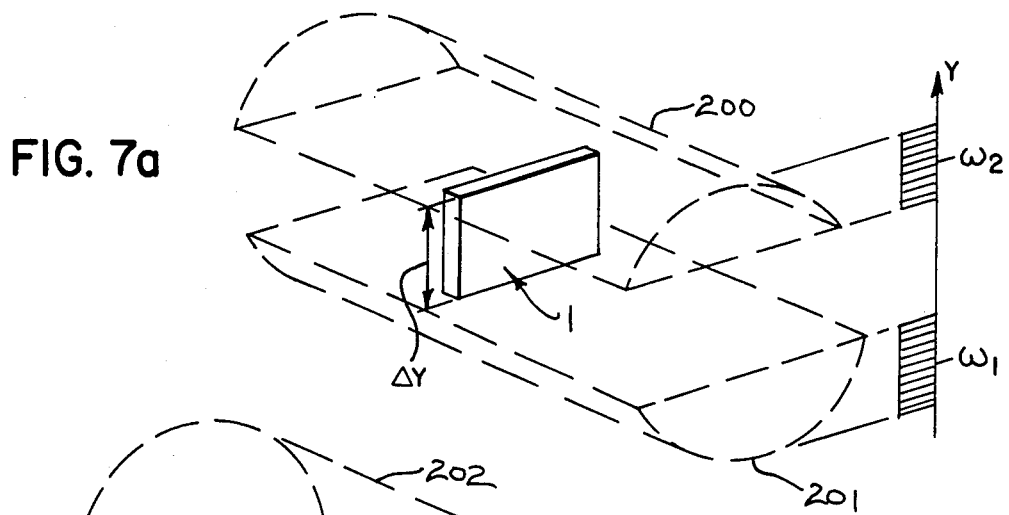
FIGS. 7a–7c are schematic illustrations of the regions surrounding the volume of interest which are saturated in accordance with the present invention.
Figure 7B:
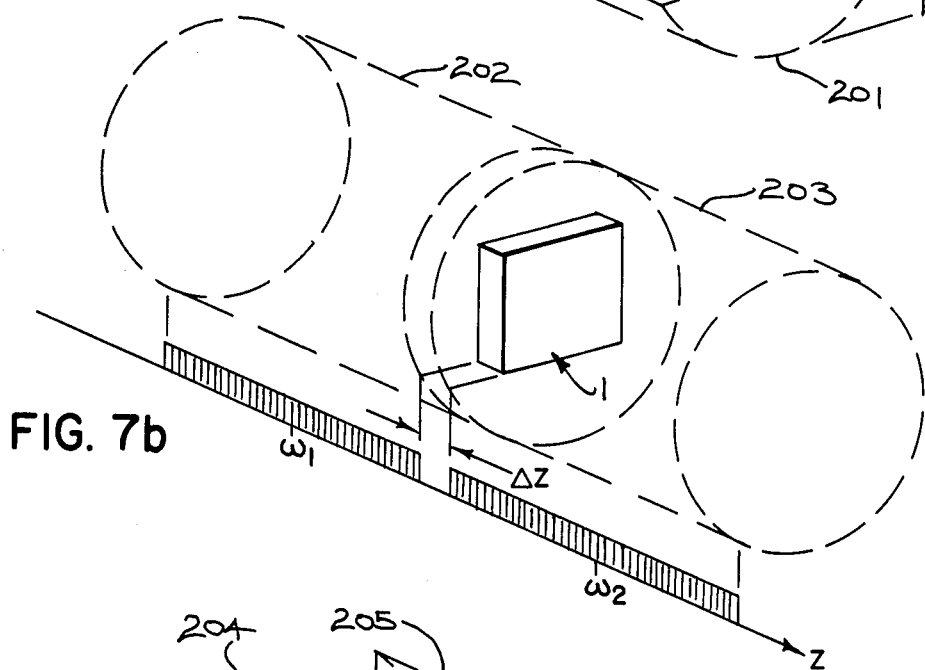
Figure 7C:
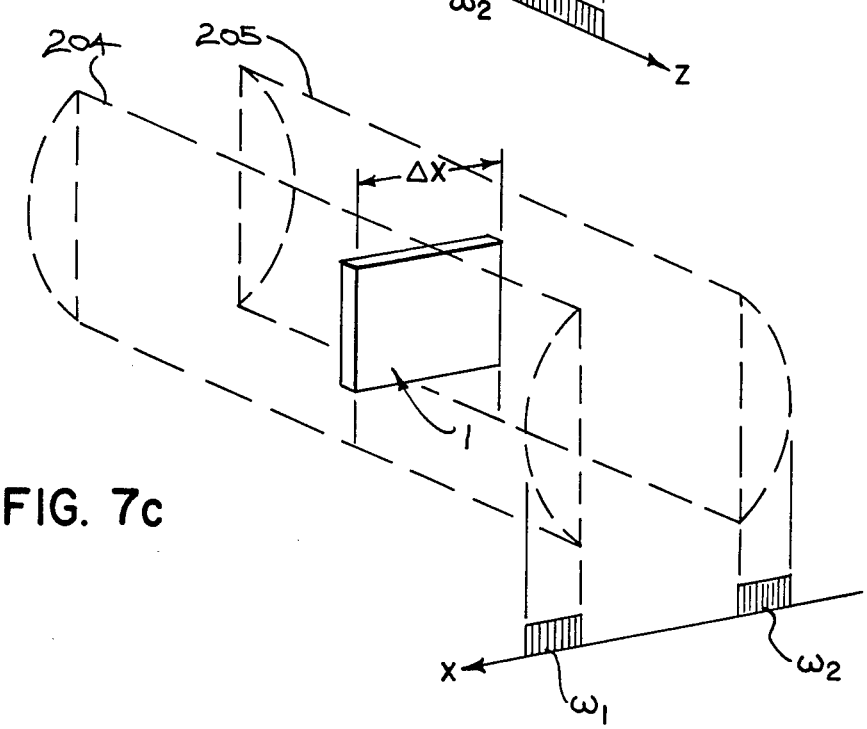
Figure 9A:
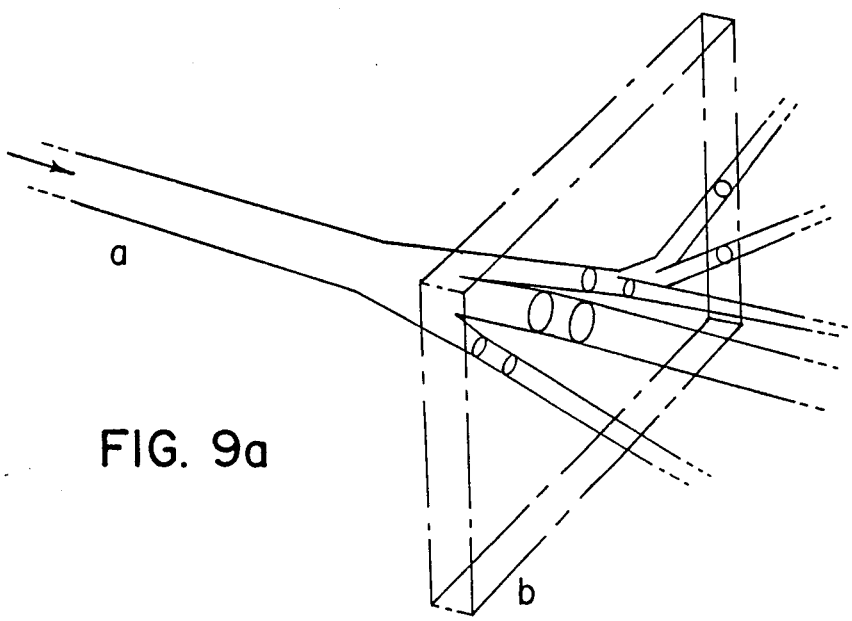
FIGS. 9a–9c are pictoral representations of a typical NMR image which illustrate the artifacts suppressed by the present invention.
Figure 9B:
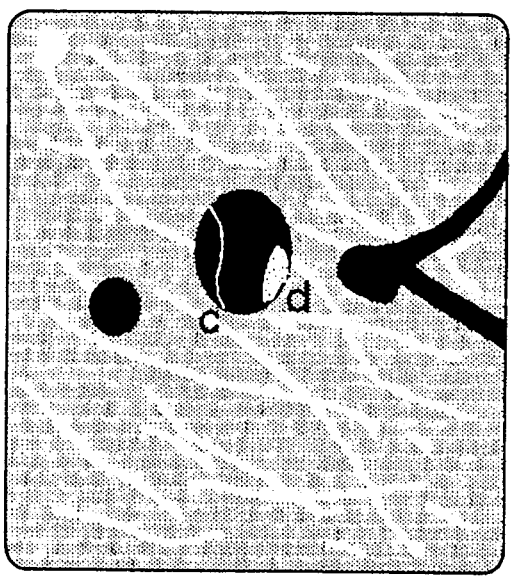
Figure 9C:
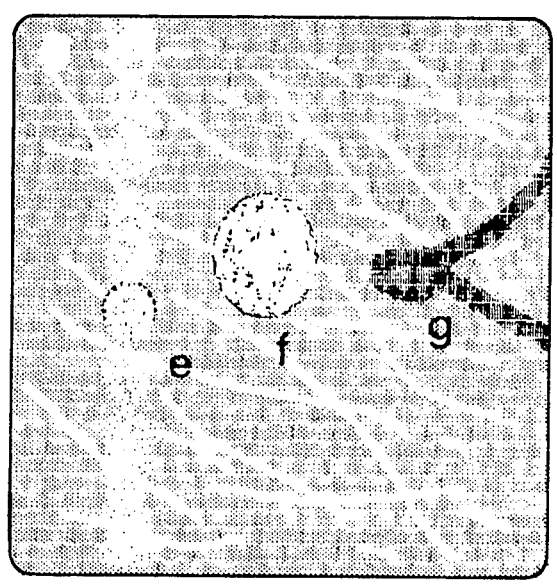

Referring to FIG. 7a, the volume of interest 1 occupies a height $\Delta y$ between upper and lower adjacent regions 200 and 201. Similarly, as shown in FIG. 7b, the slice 1 occupies a thickness $\Delta z$ between two axial regions 202 and 203 and, as shown in FIG. 7c, it occupies a width $\Delta x$ between two lateral regions 204 and 205. It should be apparent that the adjacent regions 200–205 overlap to a great extent, but as will become apparent from the description below, this is of no concern when practicing the present invention.

Figure 6:
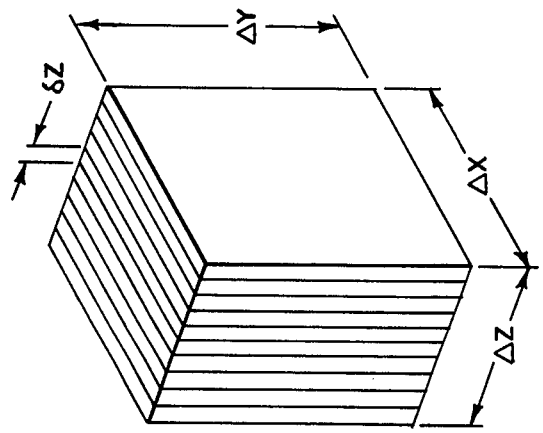
FIG. 6 is a graphic representation of a region of interest comprised of a plurality of slices such as that shown in FIG. 4.

In most medical applications the volume of interest 1 is more commonly a series of adjacent slices. This is shown in FIG. 6 where the axial dimension $\Delta z$ of the volume of interest is broken into a series of subincrements $\delta z$ which define ten slices. These slices are scanned in an interleaved manner with data for a single view being obtained from each slice in a preselected order. The sequence is repeated with different values of the phase-encoding gradient ($G_y$) until NMR data for all views in each slice is obtained. The advantage of this multi-slice method is that many sections can be acquired in the total time it takes to acquire NMR data for a single section. In other words, after an NMR measurement cycle has been performed in one particular section, NMR measurement cycles may be performed in other sections, while the longitudinal magnetization is recovering in the first section.

Figure 5:
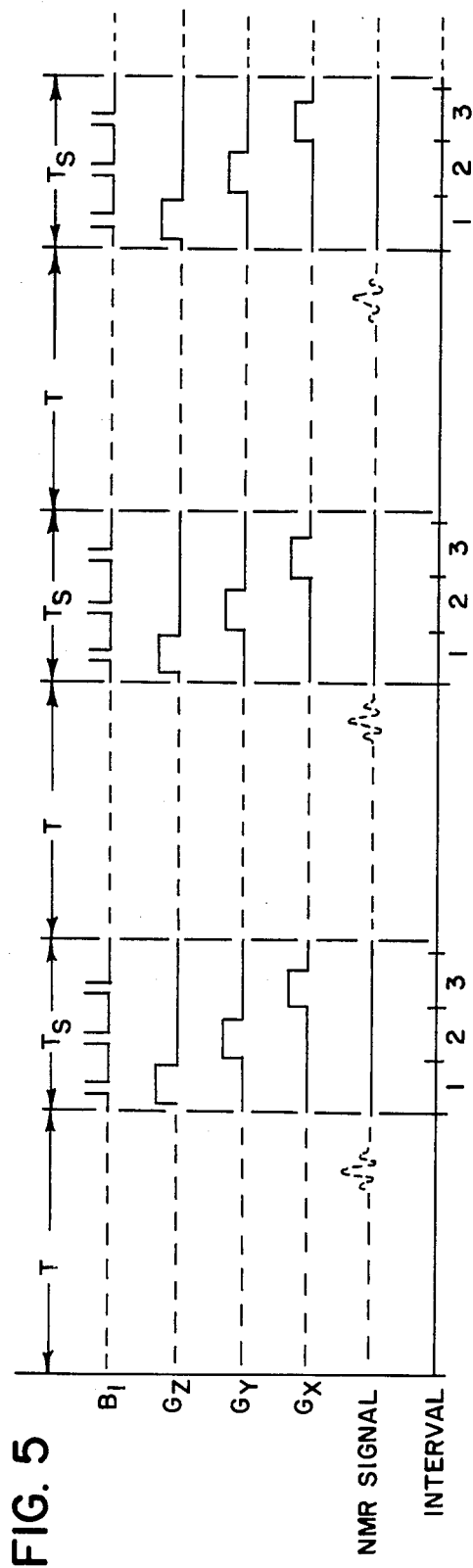
FIG. 5 is an exemplary NMR pulse sequence to which the present invention has been added.

A preferred pulse sequence which practices the present invention is illustrated in FIG. 5. This sequence is comprised of a series of NMR measurements conducted during successive time intervals (T). These may be any of a wide variety of known NMR measurements. These NMR measurements (T) are interspersed with saturation pulse sequences ($T_S$). Whereas, each NMR measurement (T) excites and receives an NMR signal from within the volume of interest, the saturation pulse sequences ($T_S$) excite and saturate the spins in the surrounding regions. It should be apparent that the particular NMR measurement which is employed in this sequence is not important to the present invention. For example, the successive NMR measurements (T) may be from a single slice, or they may be from multiple slices within the volume of interest. The NMR measurements (T) may excite only spins in a slice 1, or one or more excitation pulses $B_1$ therein may be nonselective and serve to further modify the magnetization of the spins outside the volume of interest. The preferred NMR pulse sequence (T) is described above with reference to FIG. 3, and it is employed in a multiple slice scan as illustrated in FIG. 6. Each NMR measurement (T) has a period of from 20 to 80 milliseconds.

Referring still to FIG. 5, each saturation pulse sequence ($T_S$) is comprised of three intervals 1, 2 and 3. Each interval includes the application of a magnetic field gradient $G_z$, $G_y$ or $G_x$, and the concurrent application of a pair of 90° transverse excitation pulses $B_1$. The strength of the magnetic field gradient and the frequency and frequency bandwidth of the excitation pulses $B_1$ are chosen such that spins outside the volume of interest are excited.

Referring particularly to FIGS. 5 and 7b, during the interval 1 of each saturation pulse sequence ($T_S$), a magnetic field gradient $G_z$ is applied which establishes conditions for resonance throughout the lumen. Because of this gradient, the Larmor resonant frequency changes as a function of position along the z axis. A first 90° transverse excitation pulse $B_1$ is then applied having a center frequency $w_1$ and a frequency bandwidth which is of sufficient width to produce resonance throughout the region 202 located to one side of the slice 1. A second 90° transverse excitation pulse $B_1$ is then applied having a center frequency $w_2$ and a frequency bandwidth sufficient to produce resonance throughout the region 203 located to the other side of the slice 1. In this manner, the spins in the axial regions 202 and 203 are subjected to a 90° transverse excitation during interval 1 of each saturation pulse sequence ($T_S$).

Referring particularly to FIGS. 5 and 7a, during interval 2 of the saturation pulse sequence ($T_S$) a magnetic field gradient $G_y$ is applied which establishes conditions for resonance throughout the lumen. In this case, the Larmor resonant frequency changes as a function of distance along the vertical y axis. Two 90° transverse excitation pulses $B_1$ are applied, the first of which has a base frequency $w_1$ and a frequency bandwidth sufficient to excite resonance throughout the region 201. The second $B_1$ pulse is centered around frequency $w_2$ and it has a frequency bandwidth sufficient to excite resonance throughout the region 200. As a consequence, during interval 2 of each saturation pulse sequence ($T_S$), the spins in surrounding regions 200 and 201 are subjected to 90° transverse excitation.

This is followed by interval 3 in which a magnetic field gradient $G_x$ is applied to the entire lumen. Referring to FIGS. 5 and 7c, this establishes conditions for Larmor resonance throughout the lumen, with the frequency of such resonance being a function of position along the horizontal x axis. A first transverse excitation pulse $B_1$ is then applied having a frequency $w_1$ and frequency bandwidth selected to excite resonance within the region 204. This is followed by a second 90° transverse excitation pulse $B_1$ which has a base frequency $w_2$ and a frequency bandwidth sufficient to excite resonance throughout the region 205. The spins in the two lateral regions 204 and 205 are thus subjected to 90° excitation pulses during interval 3 of each saturation pulse sequence ($T_S$). A time period of approximately six milliseconds is required to saturate spins along each axis, and thus, the time required for each saturation pulse sequence ($T_S$) is approximately 18 milliseconds.

After each NMR measurement pulse sequence (T), the spins surrounding the volume of interest are subjected to a transverse excitation field pulse $B_1$. Where ten separate slices are being imaged, for example, the surrounding spins are thus subjected to transverse excitation pulses $B_1$ at a rate which is at least ten times greater than that in any single slice. As a result, the spins outside the volume of interest are much more saturated than those inside, and any NMR signal which they might produce during the NMR measurement sequence is suppressed.

While the preferred saturation pulse sequence ($T_S$) is comprised of three intervals, one for each axis, it may not be necessary to employ all three intervals. Each interval requires approximately six milliseconds to perform, and by eliminating one or more of them during each saturation pulse sequence ($T_S$), total scan time can be reduced. For example, where disturbing artifacts are being produced in a particular image by blood flowing in a vessel oriented primarily along the z axis, only the first interval may be required. In other words, by saturating the spins in the adjacent axial regions 202 and 203 (FIG. 7b), this disturbing artifact is eliminated. On the other hand, where artifacts are due to blood flowing in many directions, two or perhaps all three of the saturation pulse sequence intervals may be required to obtain the desired image quality.

A similar reduction in the number of saturation pulse sequence intervals may be possible, for example, where the disturbing artifact is due to aliasing along one axis of the image (i.e. the phase-encoding axis). In such case, the second interval only is employed to saturate spins located above and below the slice 1 in the regions 200 and 201 shown in FIG. 7a. These spins would otherwise produce NMR signals which are improperly interpreted by the reconstruction process and aliased into the desired image, but their magnitude is minimal due to their saturated condition. As a result, the artifact is either eliminated entirely from the image or diminished substantially in intensity.

The present invention is particularly easy to implement with the multi-slice sequence described above. The saturation pulse sequence ($T_S$) is interleaved between each NMR measurement (T). In a ten slice sequence, therefore, this means that the surrounding regions are subjected to transverse excitation pulses $B_1$ at a rate ten times that in any of the slices. The surrounding spins are very substantially saturated in this case and artifact producing signals are suppressed. However, it is not necessary to "super" saturate the surrounding spins in this manner in order to obtain improved results. An improvement is achieved in accordance with the present invention any time the spins outside the volume of interest are subjected to the same or more transverse excitation compared to that employed during the NMR measurement within the volume of interest.

It should be apparent that many variations are possible from the above-described pulse sequence. For example, rather than applying pairs of transverse excitation pulses $B_1$ during each segment of the saturation pulse sequence ($T_S$), a single pulse having the proper frequency and frequency spectrum content can be employed. For example, such an excitation pulse would have a frequency bandwidth sufficient to excite resonance along the entire extent of the lumen. However, a small band of frequencies corresponding to those at the volume of interest are removed so that excitation does not occur within the volume of interest. The advantage of this alternative is that it allows the saturation pulse interval to be shortened with a consequent reduction in overall scan time.

Another alternative, which may be used when pairs of excitation pulses are employed, is to switch the strength of the magnetic field gradient $G_x$, $G_y$ or $G_z$ between two levels rather than change the base frequency $w_1$ and $w_2$ of each excitation pulse $B_1$. The particular method used will probably be a function of the particular capabilities of the NMR scanner system in which the method is to be practiced.

And finally, while the invention has been described with respect to a volume of interest oriented along the axes of a Cartesian coordinate system, this need not be the case. Just as the volume of interest may be defined by magnetic field gradients which are not parallel to an axis of the reference coordinate system, the boundaries of the surrounding regions can be defined by a similar combination of magnetic field gradients. Referring to FIG. 5 for example, in such case each pair of transverse excitation pulses B would be produced concurrently with more than one magnetic field gradient $G_x$, $G_y$ or $G_z$. The vector sum of these magnetic field gradients will determine the direction or orientation of the region being saturated.

It should be apparent to those skilled in the art that the present invention saturates the spins outside the region of interest such that their net longitudinal magnetization when the NMR signal is acquired is minimal. While such saturation is often accomplished by applying saturation pulses having a nutation angle of 90°, there are situations in which other nutation angles are preferred. For example, a nutation angle greater than 90° may be employed with materials having a very short $T_1$, because the net longitudinal magnetization swings through null from its negative value at the moment the NMR signal is acquired. Also, significant benefits can be achieved with nutation angles less than 90°.

We claim:

1. A method for eliminating artifacts in an NMR image of a volume of interest, the steps comprising:
    acquiring NMR data for reconstructing the NMR image as a series of NMR measurements which each excite spins in the volume of interest;
    executing a series of saturation pulse sequences which are interleaved with the NMR measurements, wherein each saturation pulse sequence includes the steps of:
    (a) producing a magnetic field gradient which establishes Larmor resonant conditions in an adjacent region outside the volume of interest; and
    (b) producing a transverse excitation field pulse which causes saturation of spins located in said adjacent region but not in the volume of interest; and
    wherein the saturation pulse sequence is executed at a rate which maintains the net longitudinal magnetization of the spins in said adjacent region at a magnitude less than that of the spins in the volume of interest.

2. The method as recited in claim 1 in which the saturation pulse sequence further includes the steps of:
    (c) producing a second magnetic field gradient which establishes Larmor resonant conditions in a second adjacent region outside the volume of interest; and
    (d) producing a second transverse excitation field pulse which causes Larmor resonance in spins located in said second adjacent region but not in said volume of interest.

3. The method as recited in claim 2 in which the saturation pulse sequence further includes the steps of;
    (e) producing a third magnetic field gradient which establishes Larmor resonant conditions in a third adjacent region outside the volume of interest; and
    (f) producing a third transverse excitation field pulse which causes Larmor resonance in spins located in said third adjacent region but not in said volume of interest.

4. The method as recited in claim 2 in which said two magnetic field gradients are orthogonal.

5. The method as recited in claim 1 in which the adjacent region is located on opposite boundaries of the volume of interest along the direction of the magnetic field gradient; and
    the transverse excitation field pulse is produced as a pair of pulses, each containing frequencies which cause nuclear magnetic resonance in respective ones of said two opposing adjacent regions.

* * * * *

UNITED STATES PATENT AND TRADEMARK OFFICE
CERTIFICATE OF CORRECTION

PATENT NO.   : 4,715,383

DATED        : December 29, 1987

INVENTOR(S)  : Richard L. Ehman, et al

It is certified that error appears in the above-identified patent and that said Letters Patent is hereby corrected as shown below:

Title page:

[73]   Assignee:   should read --Mayo Medical Resources, Rochester, Minn.--.

Signed and Sealed this

Thirty-first Day of May, 1988

Attest:

DONALD J. QUIGG

Attesting Officer

Commissioner of Patents and Trademarks

REEXAMINATION CERTIFICATE (2708th)

United States Patent [19]
Ehman et al.

[11] B1 4,715,383
[45] Certificate Issued  Oct. 31, 1995

[54] METHOD FOR REDUCING ARTIFACTS IN NMR IMAGES

[75] Inventors: Richard L. Ehman; Joel P. Felmlee, both of Rochester, Minn.

[73] Assignee: Mayo Medical Resources, Rochester, Minn.

Reexamination Request:
No. 90/003,739, Feb. 21, 1995

Reexamination Certificate for:
Patent No.: 4,715,383
Issued: Dec. 29, 1987
Appl. No.: 928,504
Filed: Nov. 10, 1986

[51] Int. Cl.$^6$ .................................................. A61B 5/055
[52] U.S. Cl. ........................................ 128/653.2; 324/309
[58] Field of Search ...................... 128/653.2; 324/306, 324/307, 309

[56] References Cited

U.S. PATENT DOCUMENTS

| | | | |
|---|---|---|---|
| 4,021,726 | 5/1977 | Garroway et al. | 324/0.5 A |
| 4,506,223 | 3/1985 | Bottomley et al. | 324/309 |
| 4,535,290 | 8/1985 | Post et al. | 324/309 |
| 4,549,137 | 10/1985 | Suzuki | 324/309 |
| 4,707,658 | 11/1987 | Frahm et al. | 324/309 |

OTHER PUBLICATIONS

W. P. Aue et al., "Volume–Selective Excitation, A Novel Approach to Topical NMR", *JMR*, pp. 350–354 1984.
Ching–Ming Lai et al., "Nuclear Magnetic Resonance Zeumatography For Medical Imaging", *Electro/78 Conference Record*, May 1978.
B. R. Rosen et al., "Selective Saturation NMR Imaging", *J. Comput Assist Tomogr.*, pp. 813–818, Oct. 1984.
A. N. Garroway et al., "Image Formation in NMR by a Selective Irritative Process", *J. Phys. C: Solid State Phys.*, vol. 7, 1974.
Peter R. Luyten et al. "Observations of Metabolites in the Human Brain by 1H MR Spectroscopy at 1.5T", *Scientific Program*, vol. 157(P), p. 321, Nov. 20, 1985.
Dyx J. Jensen et al., "Pulse Sequence Design for Volume Selective Excitation in Magnetic Resonance," *Am. Assoc. Phys. Med.*, Med. Phys. 14(1), pp. 38–42 Jan./Feb. 1987.
S. Muller et al., "Practical Aspects of Volume–Selective Excitation (VSE), Compensation Sequences" *JMR* 65, 332–228, 1985.
P. R. Luyten et al., "H MR Spatially Resolved Spectroscopy of Human Tissues in Situ", *Mag. Res. Imaging* vol. 4, pp. 237–239, 1986.
P. R. Luyten et al., "Solvent–Suppressed Spatially Resolved Spectroscopy, An Approach to High–Resolution NMR on a Whole–Body MR System", *JMR* 67, 148–155, 1986.
Luyten et al, "Target Imaging Using Volume Selective Excitation", SMRM 1985.

*Primary Examiner*—Ruth S. Smith

[57] ABSTRACT

A method for eliminating flow, motion and aliasing artifacts includes a series of saturation pulse sequences which are interleaved with the NMR pulse sequences used to acquire the data needed to reconstruct the desired image. Whereas, the NMR pulse sequences extract data from the volume of interest to be imaged, the saturation pulse sequences excite and saturate spins in the adjacent regions.

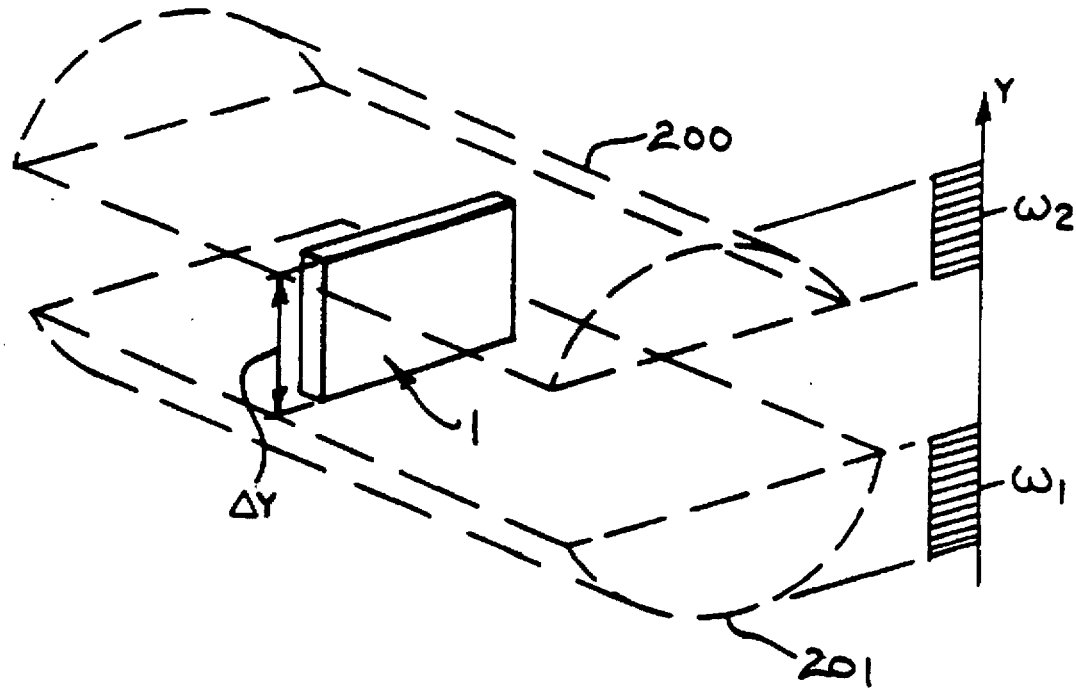

REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1–5 is confirmed.

* * * * *